(12) United States Patent
Lystad et al.

(10) Patent No.: US 9,919,863 B2
(45) Date of Patent: Mar. 20, 2018

(54) RETICLE POD WITH COVER TO BASEPLATE ALIGNMENT SYSTEM

(71) Applicant: ENTEGRIS, INC., Billerica, MA (US)

(72) Inventors: John Lystad, Bloomington, MN (US); Steven P. Kolbow, Chaska, MN (US)

(73) Assignee: ENTEGRIS, INC., Billerica, MA (US)

(*) Notice: Subject to any disclaimer, the term of this patent is extended or adjusted under 35 U.S.C. 154(b) by 303 days.

(21) Appl. No.: 14/437,121

(22) PCT Filed: Oct. 17, 2013

(86) PCT No.: PCT/US2013/065506
§ 371 (c)(1),
(2) Date: Apr. 20, 2015

(87) PCT Pub. No.: WO2014/062956
PCT Pub. Date: Apr. 24, 2014

(65) Prior Publication Data
US 2015/0266660 A1 Sep. 24, 2015

Related U.S. Application Data

(60) Provisional application No. 61/716,445, filed on Oct. 19, 2012.

(51) Int. Cl.
*B65D 85/48* (2006.01)
*G03F 1/66* (2012.01)
(Continued)

(52) U.S. Cl.
CPC ............. *B65D 85/48* (2013.01); *B65D 25/10* (2013.01); *B65D 25/14* (2013.01); *B65D 43/02* (2013.01);
(Continued)

(58) Field of Classification Search
CPC ........ B65D 25/10; B65D 25/14; B65D 85/48; H01L 21/67353; H01L 21/67359
(Continued)

(56) References Cited

U.S. PATENT DOCUMENTS 5,054,418 A * 10/1991 Thompson ........ H01L 21/67303
118/500
5,314,068 A    5/1994 Nakazato et al.
(Continued)

FOREIGN PATENT DOCUMENTS

JP   H06-305554 A   11/1994
JP   H11-79274 A    3/1999
(Continued)

*Primary Examiner* — Luan K Bui

(57) ABSTRACT

An alignment system for aligning the cover and base of an inner pod of a reticle carrier. The cover and base can each be provided with hard planar surface seal zones on the bottom surface and the top surface, respectively. The cover of the inner pod may be provided with a through hole or a blind hole into which an alignment pin is disposed. The base is provided with a guide recess to receive the distal end of the alignment pin. The alignment pin operates to limit contact surface area between the cover and the base during that is in sliding contact, thus inhibiting particulate generation. Low particulate-generating materials, such as stainless steel or polyamide-imide, can also be utilized to further reduce particulate generation. Furthermore, the cover and base can each be unitary without need for fastening components thereto, thereby eliminating clamped surfaces that can entrap and subsequently shed particulates.

18 Claims, 7 Drawing Sheets

(51) Int. Cl.
    *H01L 21/673* (2006.01)
    *B65D 25/10* (2006.01)
    *B65D 25/14* (2006.01)
    *B65D 43/02* (2006.01)

(52) U.S. Cl.
    CPC .......... *G03F 1/66* (2013.01); *H01L 21/67353* (2013.01); *H01L 21/67359* (2013.01); *H01L 21/67373* (2013.01); *H01L 21/67383* (2013.01); *H01L 21/67386* (2013.01); *Y10T 29/49895* (2015.01)

(58) Field of Classification Search
    USPC .......................... 206/454, 710, 711; 29/464
    See application file for complete search history.

(56) References Cited

U.S. PATENT DOCUMENTS

| | | | |
|---|---|---|---|
| 5,948,690 A * | 9/1999 | Ju | G01N 1/34 206/205 |
| 6,216,873 B1 * | 4/2001 | Fosnight | G03F 1/66 206/454 |
| 6,338,409 B1 * | 1/2002 | Neary | G03F 1/66 206/454 |
| 6,727,029 B1 | 4/2004 | Wu et al. | |
| 6,988,620 B2 * | 1/2006 | Haggard | H01L 21/67369 206/710 |
| 7,008,487 B1 | 3/2006 | Hedges et al. | |
| 7,528,936 B2 * | 5/2009 | Gregerson | G03B 27/58 206/710 |
| 7,607,543 B2 | 10/2009 | Gregerson et al. | |
| 8,231,005 B2 | 7/2012 | Kolbow et al. | |
| 2003/0010657 A1 * | 1/2003 | Zabka | H01L 21/67353 206/303 |
| 2004/0256285 A1 * | 12/2004 | Forsyth | H01L 21/67373 206/710 |
| 2007/0187286 A1 * | 8/2007 | Pylant | H01L 21/67386 206/710 |
| 2007/0206173 A1 | 9/2007 | Suzuki et al. | |
| 2009/0095650 A1 * | 4/2009 | Pylant | H01L 21/67369 206/710 |
| 2009/0301917 A1 | 12/2009 | Kolbow et al. | |
| 2012/0037522 A1 | 2/2012 | Chiu et al. | |
| 2012/0175279 A1 | 7/2012 | Ku et al. | |

FOREIGN PATENT DOCUMENTS

| | | |
|---|---|---|
| JP | H11-255332 A | 9/1999 |
| JP | 3070851 U | 8/2000 |
| JP | 2003-100851 A | 4/2003 |
| JP | 2007-210655 A | 8/2007 |
| JP | 2007-266453 A | 10/2007 |
| JP | 2008-294221 A | 12/2008 |
| KR | 10-2007-0030253 A | 3/2007 |
| KR | 10-2011-0021685 A | 3/2011 |
| WO | 2014/062956 A1 | 4/2014 |

* cited by examiner

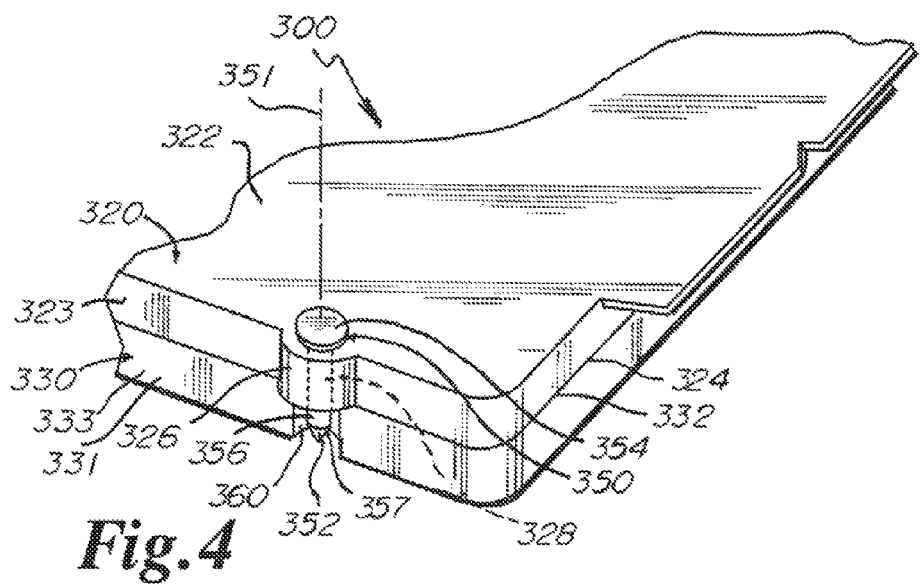
*Fig. 4*
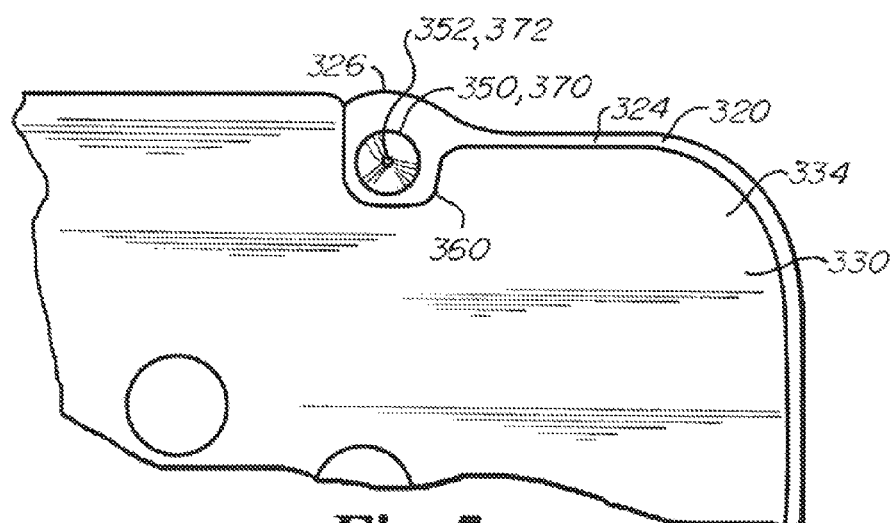
*Fig. 5*
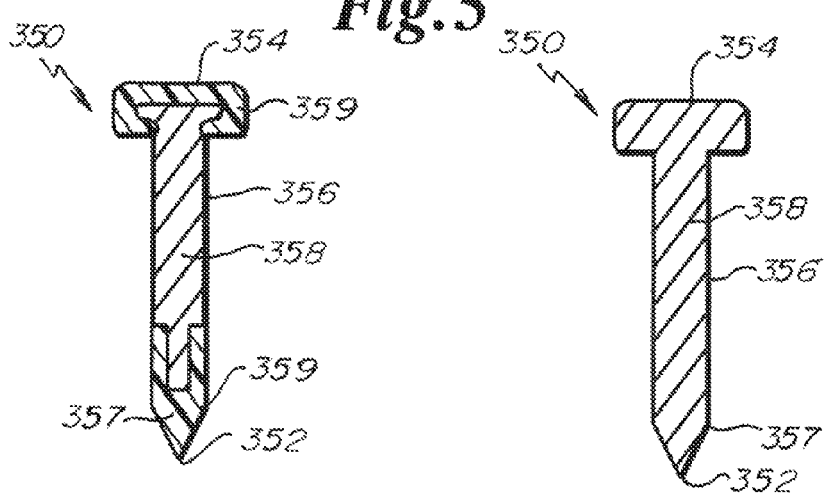
*Fig. 6A*  *Fig. 6B*

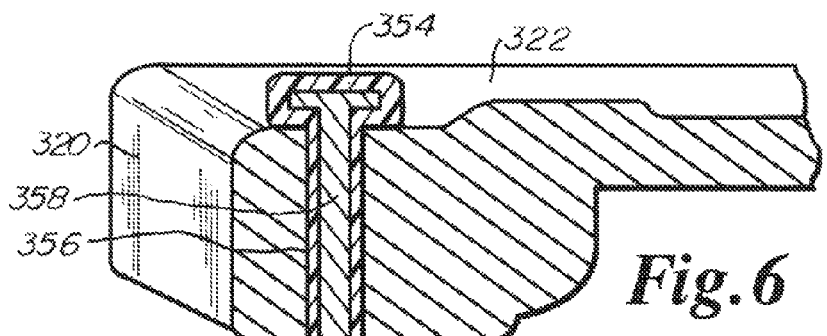
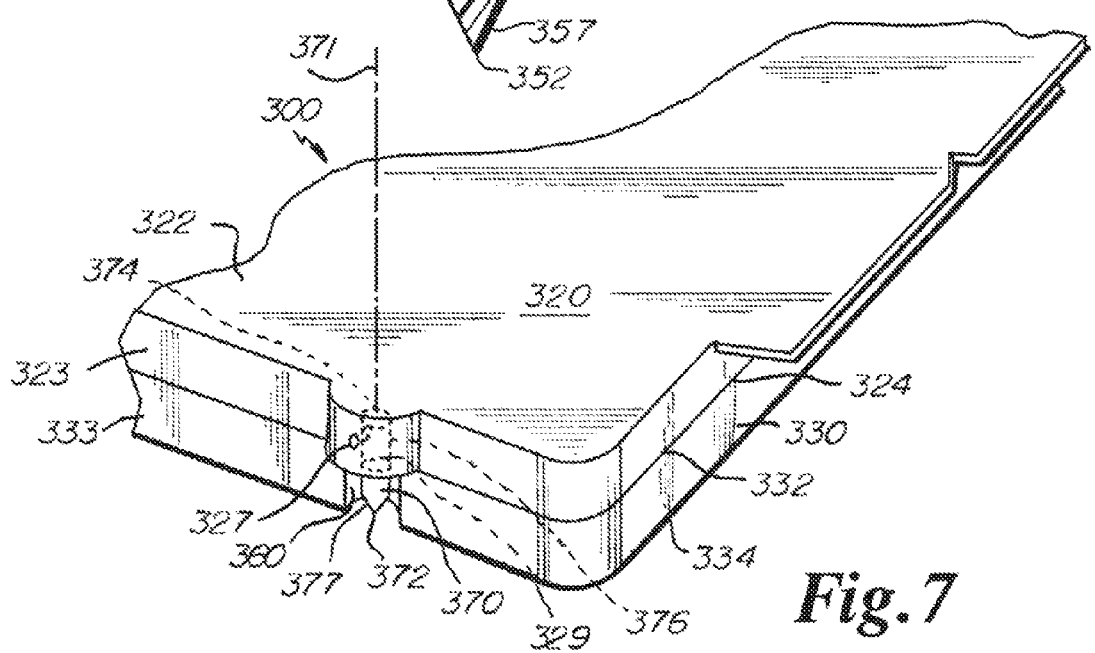
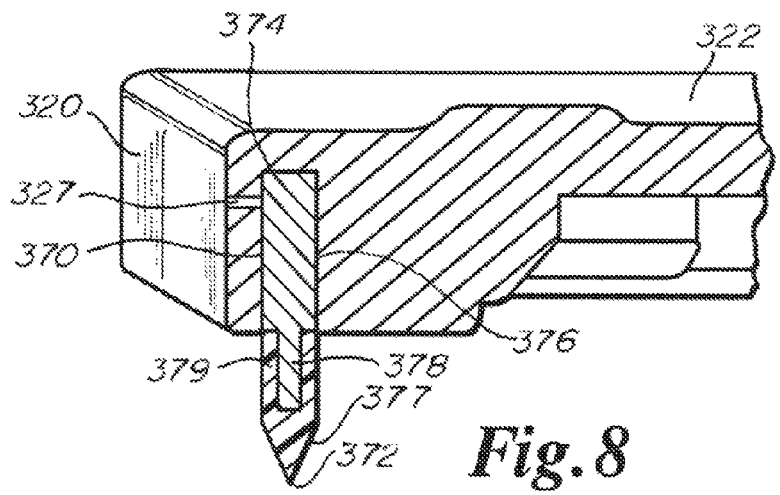

RETICLE POD WITH COVER TO BASEPLATE ALIGNMENT SYSTEM

RELATED APPLICATIONS

This present application is a National Phase entry of PCT Application No. PCT/US2013/065506, filed Oct. 17, 2013, which claims priority to U.S. Provisional Application No. 61/716,445, filed Oct. 19, 2012, the disclosures of which are incorporated by reference in their entireties.

FIELD OF THE INVENTION

This invention relates generally to a container for storage, transport, shipping and processing of fragile devices such as photomasks, reticles and wafers. More specifically, the invention relates to alignment of extreme ultraviolet (EUV) pods.

BACKGROUND OF THE INVENTION

One of the process steps commonly encountered in the fabrication of integrated circuits and other semiconductor devices is photolithography. Broadly, photolithography involves selectively exposing a specially prepared wafer surface to a source of radiation using a patterned template to create an etched surface layer. Typically, the patterned template is a reticle, which is a very flat glass plate that contains the patterns to be reproduced on the wafer. Typical reticle substrate material is optically clear quartz. Because of the tiny size of the critical elements of modern integrated circuits, the operative surface of the reticle (i.e. the patterned surface) is kept free of contaminants that could either damage the surface or distort the image projected onto the photoresist layer during processing, both of which lead to a final product of unacceptable quality.

Generally, reticles are stored and/or transported within a mini-clean room type environment created within a SMIF container or pod having a base and a cover. The cover mates with the base to form a hermetically sealed enclosure for holding the reticle.

Considering the severe impact of particulates on semiconductor fabrication, unnecessary and unintended contact between the reticle and other surfaces during manufacturing, processing, shipping, handling, transport or storage is highly undesirable in view of the susceptibility of the reticle to damage to the delicate features on the patterned surface due to sliding friction and abrasion. Also, any particulate contamination of the surface of the reticle can compromise the reticle to a degree sufficient to seriously affect any end product obtained from the use of such a reticle during processing. Particles can be generated within the controlled environment containing the reticle during processing, transport and shipping. Sliding friction between the reticle and the container and between the components of the container are sources of contaminating particulates. Also, it is now known that gases and minute quantities of moisture can escape from the polymer materials used in reticle containers, such can cause haze and crystal growth on reticles damaging same.

Photolithography is moving towards utilizing extreme ultraviolet (EUV) light sources with shorter wavelengths that permit production of smaller sized integrated circuits, often in a vacuum environment, thus imposing heightened functional requirements on a container or pod designed to store, transport and ship a reticle destined for EUV photolithography use. For example small particles that are not big enough to cause a problem in conventional photolithography can be a significant problem in EUV photolithography. Also, EUV photolithography can be performed under a vacuum which can make outgassing and/or moisture desorption from container components an issue, particularly when the components are polymers.

Pods used for EUV lithography typically utilize an inner pod and an outer pod. Examples can be found at U.S. Pat. No. 8,231,005 to Kolbow et al. ("Kolbow") and U.S. Pat. No. 7,607,543 to Gregerson et al. ("Gregerson"), both owned by the owner of the instant application and the disclosures of which are hereby incorporated by reference herein in their entirety except for express definitions contained therein. The inner pod is conventionally metal to eliminate outgassing or moisture desorption common with polymers and to provide a machined planar surface to planar surface seal. Aluminum with an electroless nickel plating thereon is suitable. The sealing of the inner pod as disclosed by Kolbow is a flat metallic surface to a flat metallic surface.

A concern is that particulate generation and entrapment that heretofore was tolerated in reticle pod carriers can become problematic in the context of carriers containing reticles for EUV photolithography use (e.g., particles generated between vertically sliding surfaces when the cover is mounted to the base, and particles entrapped between fasteners and fastened surfaces). A system that addresses such particle generation and entrapment would be a welcomed advance in photolithography generally and in EUV photolithography in particular.

SUMMARY OF THE INVENTION

Various embodiments of the invention are directed to alignment structures that have reduced area contact between components that may be in contact during placement of the cover onto the base for closure of an inner pod of an EUV reticle carrier.

Typically the top main component and bottom main component having sealing surfaces thereon are finely machined and/or polished to a plane surface providing metal to metal flat planar cooperating sealing surfaces. A common approach for alignment of the inner pod cover and base during closing of the inner pod involves providing a pair of flange members and attaching them to the top main component at two opposing sides of the periphery of the cover, after the machining/polishing, with fasteners such as rivets. Each of the flange members extend the length of one of the sides and wrap around the adjacent corners to the side and include a robotic lift shelf. Each flange member includes a downwardly (in the z-direction) extending skirt that constrains the base as the components are assembled. The skirt provides an inward constraint that contacts the periphery of the base.

Various embodiments of the present invention provide advantages in allowing for tighter dimensional control, thus limiting sliding contact during axial motion between the cover and base. In some embodiments, an alignment pin is pressed into a machined pocket, replacing the larger area alignment surfaces that were previously clamped onto the cover using fasteners. Another advantage is the reduction in the number of components, screws, mating surfaces, grooves and crevasses, all of which can trap particulates.

Structurally, in one embodiment, the cover and base of the outer pod utilize resilient seals providing a hermetically sealed first enclosure. The inner pod can be configured with a base portion configured as a planar surface with reticle support structure and reticle constraint structure extending therefrom. A cover portion of the inner pod engages with the base portion to define the secondary enclosure and also engages the top surface of the reticle. The cover and base portion of the inner pod can provide a hermetic seal such as by an elastomeric member or by non-elastomeric seals, e.g., a seal zone comprising hard planar surface to hard planar surface contact, or can have a restricted opening, an elongated gap extending substantially around the periphery of the secondary pod to reduce pressure shock waves and inhibit particles without a hermetic seal.

Additionally, the cover and base of the inner pod can be dimensioned to complement each other when aligned and engaged. The cover and base can each be provided with hard planar surface seal zones on the bottom surface and the top surface, respectively, such that when the cover and base are aligned and engaged, the bottom of the cover to the top of the base, the seal zones mate and the inner pod is hermetically sealed. In one embodiment, the cover of the inner pod is provided with a through hole into which a locating or alignment pin is disposed. The base can be provided with a guide recess to receive the distal end of the alignment pin. When aligned and engaged, the alignment pin works to prevent or limit lateral motion between the cover and the base thus inhibiting particulate generation.

In one embodiment, the alignment pin is made of a metal, e.g., stainless steel. Another embodiment provides a blind hole in the cover with an alignment pin pressed therein.

Certain embodiment provide for a polymer ball to be disposed along the surface of a concavity within the guide recess. The polymer ball engages with the alignment pin to limit the contact surface area between the cover and the base when the cover is moved axially with respect to the base.

In some embodiments, the alignment pin includes a metal core covered with a polymer coating or sleeve. In one embodiment, the polymer is provided on the guide surface only. In another embodiment, the polymer is provided over the entire alignment pin core. In still other embodiments, the polymer is provided on the guide surface and on the pin head with the shaft encompassed by the cover remaining uncoated.

Advantages of various embodiments of the invention is to provide tighter dimensional control of pin placement due to the alignment pin being pressed into a machined through hole or blind hole, while limiting the number of components, screws, grooves, crevasses and mating surfaces that can trap particulates. Enhanced shock and vibration isolation to the reticle, as well as reducing the generation of particulates due to the axial motion of the cover against the base, can also be realized. Various embodiments of the invention can also provide a reticle inner pod that is easily opened without undue motion and operations that can cause particulate generation.

BRIEF DESCRIPTION OF THE DRAWINGS

FIG. 4 is a partial perspective view of an assembled inner pod including a through hole for receiving an alignment pin in an embodiment of the invention.

FIG. 5 is a portion of a bottom view of an assembled inner pod according to an embodiment of the invention.

FIG. 6 is a partial sectional view of the cover of an inner pod including a through hole that receives an alignment pin according to an embodiment of the invention.

FIGS. 6A and 6B are sectional views of alignment pins in embodiments of the invention.

FIG. 7 is a partial perspective view of an assembled inner pod according to an embodiment of the invention.

FIG. 8 is a cut away view of the cover of the inner pod including a blind hole that receives the alignment pin according to an embodiment of the invention.

DETAILED DESCRIPTION

Figure 1:
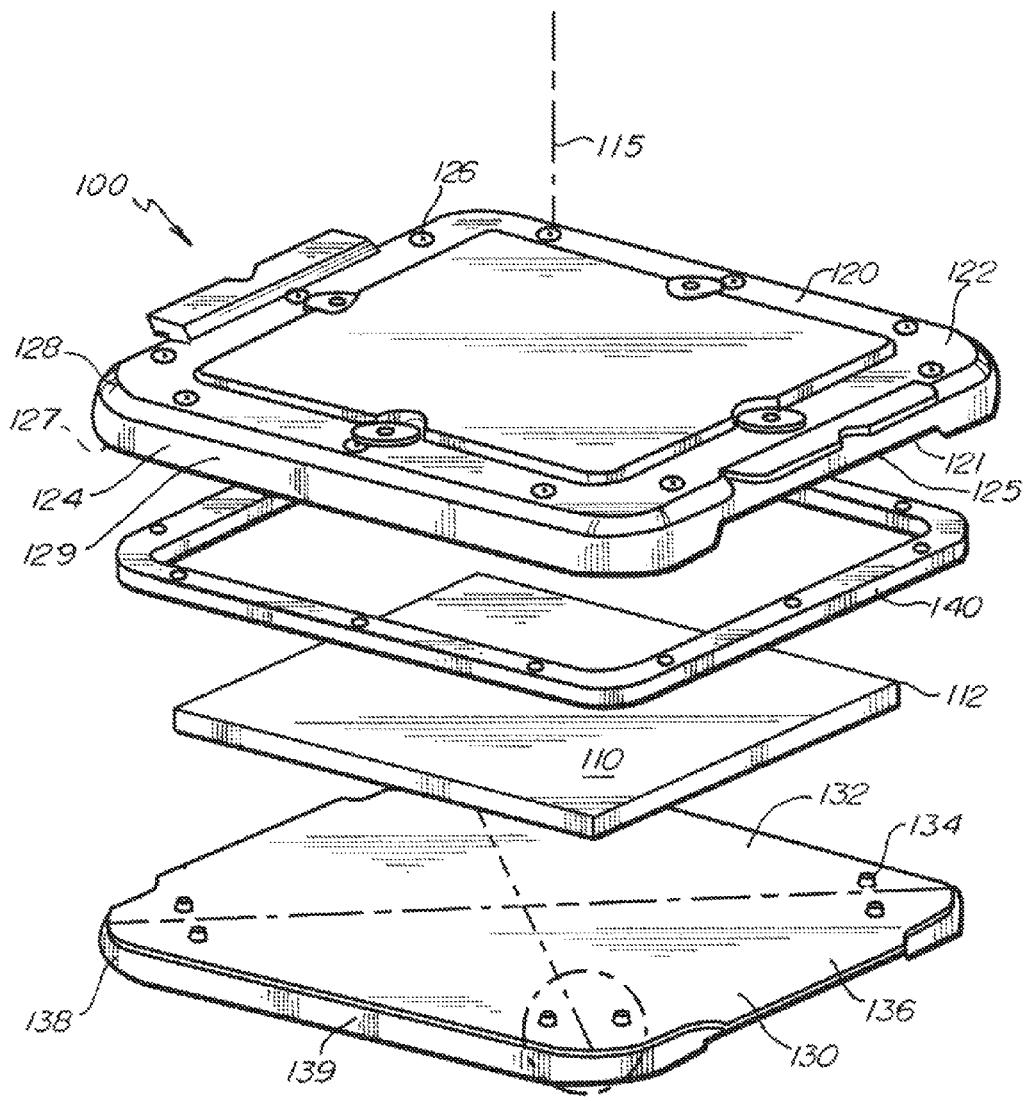
FIG. 1 is an exploded perspective view of a prior art example of an inner pod of a reticle carrier having a separate rigid seal ring and an alignment skirt surrounding the entire cover.

Referring to FIG. 1, a reticle container or inner pod 100 of the prior art is depicted. The inner pod 100 is configured, for example, as a reticle pod container, such as disclosed by Kolbow and Gregerson. The inner pod 100 generally includes a cover 120 capable of sealingly mating with a base 130 to define a hermetically sealed enclosure that holds a reticle 110 for storage, transport, processing and shipping. In FIG. 1, an alternate rigid seal ring 140 is shown as provided between the cover 120 and the base 130. The rigid seal ring 140 attaches to the cover 120 thus sealing the cover 120 to the base 130 by way of the rigid seal ring 140. The inner pod 100, seal ring 140 and reticle 110 are concentric about a central axis 115 that defines an axial direction.

The reticle 110 is located and supported near each of its corners on reticle contact members 134 mounted to the base 130. The reticle contact members 134 are mounted to the base 130 in a manner known in the art. The illustrated embodiment of FIG. 1 depicts an inner pod 100 having a shape that generally conforms to the shape of the reticle 110, in that it includes corners 122 that correspond to radiused corners 112 of the reticle 110.

A common approach in aligning the cover 120 and base 130 involves providing flanges on the periphery of the cover 120 that contact the periphery of the base 130. In FIG. 1, alignment between the cover 120 and base 130 is provided via a rigid alignment ring or skirt 124. The alignment skirt 124 is attached to the cover 120 via fasteners 126. The alignment skirt 124 has radiused corners 128 and straight side walls 129, the corners 128 and portions of the side walls 129 extending past the bottom surface 121 of the cover 120. Two opposing sides of the alignment skirt 124 are provided with recesses 125 that are flush with the bottom surface 121 of the cover 120. The base 130 is generally sized to complement the bottom surface 121 of the cover 120 and fit within the confines of the alignment skirt 124 other than two wing extensions 136 provided on opposing sides of the top surface 132 of the base 130. The base 130 has radiused corners 138 that complement the radiused corners 128 of the alignment skirt 124. Alignment of the cover 120 and base 130 requires slidably mating the inner wall 127 of the alignment skirt 124 to the outer wall 139 of the base 130 such that the wing extensions 136 fit in the alignment skirt 124 recesses 125.

Figure 2:
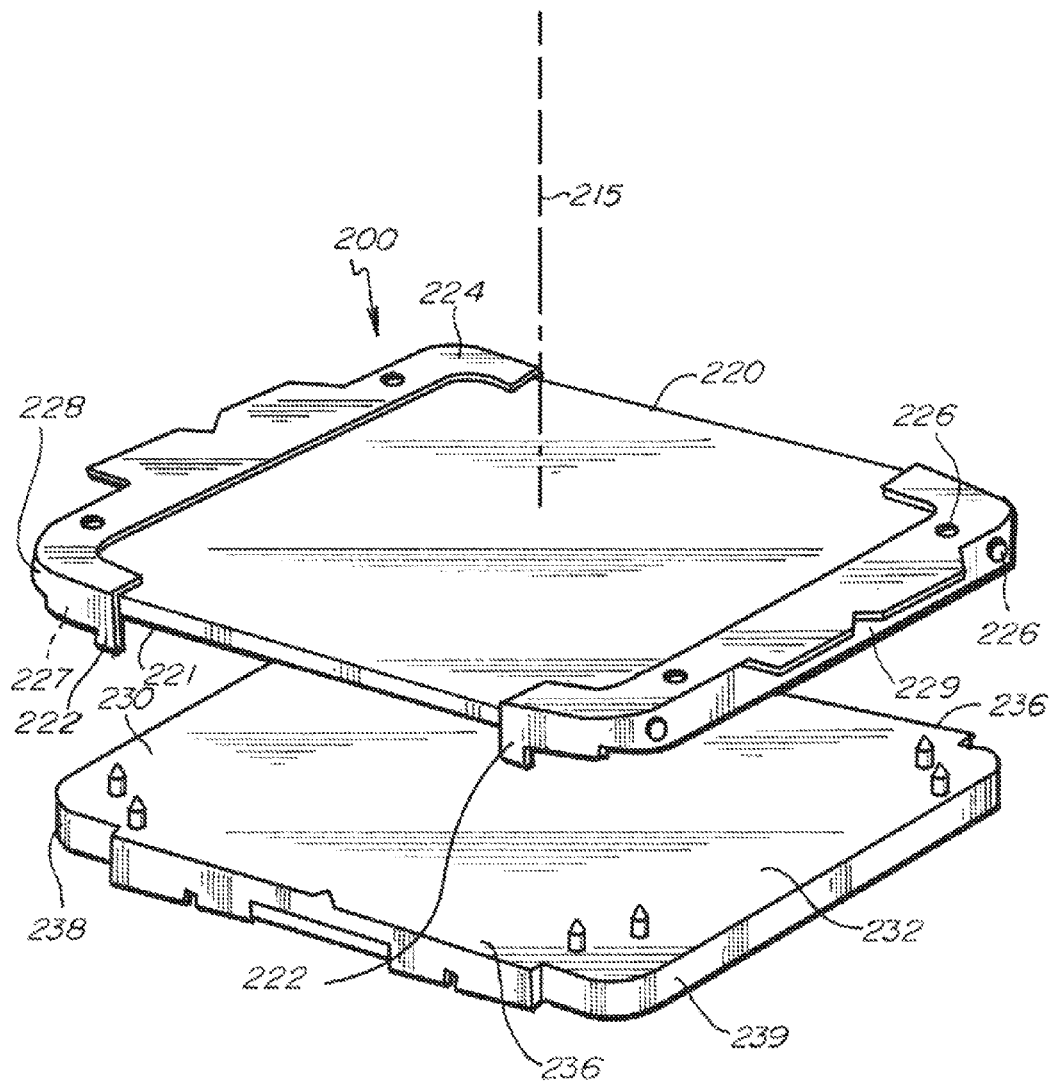
FIG. 2 is an exploded perspective view of a prior art example of an inner pod of a reticle carrier having alignment structures on opposite sides of the cover.
Figure 3:
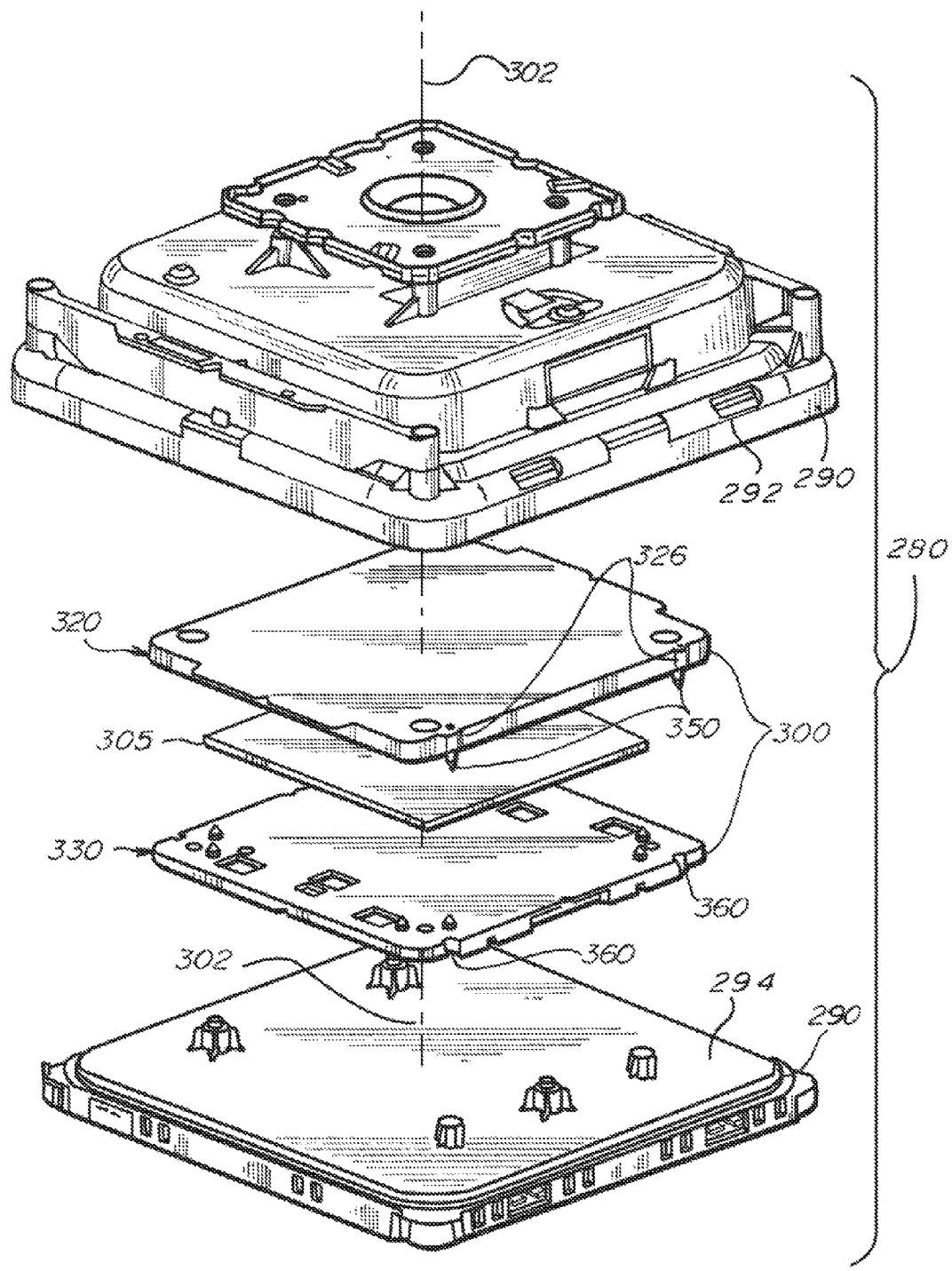
FIG. 3 is an exploded view of a reticle carrier in an embodiment of the invention.

Referring to FIG. 2, another example of an aligning cover 220 and base 230 of an inner pod 200 of the prior art is depicted (some details removed for clarity). The cover 220 and base 230 are concentric about a central axis 215 that defines an axial direction. In this example, the cover 220 is provided with two alignment structures 224. Each alignment structure 224 is configured to encompass one side wall and both adjacent corners of the cover 220. Each alignment structure 224 is attached to the cover 120 via fasteners 226. The alignment structure 224 has radiused corners 228 and straight side walls 229, the corners 228 and portions of the side walls 229 extending past the bottom surface 221 of the cover 220. Each alignment structure 224 is attached to a side wall of the cover 220, the side walls being opposite of each other. The base 230 is generally sized to complement the bottom surface 221 of the cover 220 and fit within the confines of the alignment structure 224 other than two wing extensions 236 provided on opposite sides of the top surface 232 of the base 230. The base 230 has radiused corners 238 that complement the radiused corners 228 of the alignment structure 228. Alignment of the cover 220 and base 230 requires slidably mating the inner wall 227 of the alignment structures 224 to the outer wall 239 of the base 230 such that the wing extensions 236 fit between the ends 222 of the alignment structures 224.

While the above examples provide alignment and act to limit lateral movement between the base and cover during operations involved in the storage, shipment, and transport of the reticle, there is the potential for substantial sliding contact between large surface areas during horizontal or axial movement between the cover and the base along the central axes 115 and 215 (e.g., between the inner wall 127 of the alignment skirt 124 and the outer wall 139 of the base 130 of inner pod assembly 100, or between the inner wall 227 of the alignment structures 224 and the outer wall 239 of the base 230 of the inner pod assembly 100). Such sliding contact can cause generation of particulates detrimental to reticles generally, and EUV reticles in particular.

Various embodiments of the invention are designed to address such particle generation and entrapment, as described in the various embodiments disclosed below.

Referring to FIGS. 3 through 6, a reticle carrier 280 is depicted in an embodiment of the invention. The reticle carrier 280 includes an outer pod assembly 290 and an inner pod assembly 300 concentric about a central axis 302, the inner pod assembly 300 containing a reticle 305. The outer pod assembly 290 includes an upper portion 292 and a lower portion 294 that cooperate to define an enclosure. The inner pod assembly 300 includes a cover 320 and a base 330 and can be disposed within the outer pod assembly 290. The cover 320 and the base 330 can be aligned by alignment pins 350 that extend from the cover 320. Each alignment pin 350 is characterized as defining an alignment axis 351 and as having a distal end 352 that can be positioned within a respective guide recess 360 formed on an edge 331 of the base 330. While the reticle pods depicted herein are of a generally rectangular outline, it is understood that other pods can have other shapes such as for example, a polygonal or a circular shape without departing from the scope of the invention.

The cover 320 can be of unitary construction, machined from a single block (e.g., a metal such as stainless steel). The cover 320 defines a top surface 322 opposite a bottom or interior-facing surface 324 spaced apart from the top surface 322 with a lateral surface 323 extending substantially along a plane. In one embodiment, the cover 320 can be provided with at least one protrusion 326, the protrusion 326 extending outward from the lateral surface 323 and extending from the top surface 322 to the bottom surface 324. A through hole 328 is formed at a location in the protrusion 326 for receiving the alignment pin 350. An axis of the through hole 328 is substantially perpendicular to the top surface 322. It is further contemplated that the cover 320 could be provided without the protrusion 326 and the through hole 328 be drilled substantially adjacent the lateral surface 323. The alignment pin 350 can be dimensioned for an interference fit with the hole 328.

The base 330 can also be of unitary metallic construction and includes a top or interior-facing surface 332 opposite a bottom surface 334 with a lateral surface 333 extending therebetween, the lateral surface 333 lying substantially along a plane. The base 330 can be provided with at least one guide recess 360, the guide recess 360 receding inward from the plane of the lateral surface 333 and extending through the top surface 332 and the bottom surface 334. In one embodiment, the guide recess 360 is positioned on the base 330 such that when the cover 320 is in engagement with the base 330, the distal end 352 of the alignment pin 350 is located at a precise location within the guide recess 360 resulting in a close mating engagement between the shaft portion 356 of the distal end 352 of the alignment pin 350 and the guide recess 360.

Functionally, the cover 320 and base 330 sealingly mate with each other to define a hermetically sealed enclosure having insubstantial axial movement therebetween. The formation of unitary structures for the cover 320 and base 330 eliminates or reduces the presence of surfaces that are brought into clamping contact, thereby reducing or eliminating the entrapment of particles between such clamped surfaces and the attendant shedding of particles that can occur over time. The unitary construction also eliminates manufacturing steps and reduces the tolerance buildup associated with the cover 320 and base 330.

The alignment pin 350 can comprise a shaft portion 356 having a head 354 opposite a distal end 352. In one embodiment, the distal end 352 can have a tapered portion 357. The shaft portion 356 can include a substantially uniform cross-section along its length and extends through the through hole 328 such that head 354 remains outside the through hole 328 and is proximate the top surface 322. The tapered portion 357 is characterized by a sloped surface that narrows to a radiused apex at the distal end 352, and can take on several three dimensional shapes, such as a cone, frustum or pyramid. Also, the tapered portion 357 need not be axisymmetric. In other embodiments, the distal end 352 can be substantially flat or chamfered.

Alignment pins 350 can comprise a metal core 358 and a polymer coating 359 completely encasing the metal core 358. In another embodiment, alignment pins 350 can include a metal core 358 and a polymer coating over the head 354, a portion of the shaft 356 closer the distal end 352, and the tapered portion 357 (FIG. 6A). In other embodiments, alignment pins 350 can be manufactured entirely from low particulate generating material such as stainless steel or a polyamide-imide such as TORLON (FIG. 6B).

Referring to FIG. 7, an alignment pin 370 defining an alignment axis 371 is depicted as included in the cover 320 in an embodiment of the invention. A distal end 372 of the alignment pin 370 is positioned within the guide recess 360 located on the base 330. In this embodiment, a blind hole 329 is formed at a location in the protrusion 326 to receive the alignment pin 370. The opening of the blind hole 329 is located on the bottom surface 324. A vent 327 can be provided through the lateral surface 323 and intersects the blind hole 329 adjacent the end closest to the top surface 322. In one embodiment, the axis of the blind hole 329 is substantially perpendicular to the top surface 322.

The guide recess 360 is positioned on the base 330 such that when the cover 320 is in engagement with the base 330, the distal end 372 of the alignment pin 370 is located at a precise location within the guide recess 360 resulting in a close mating engagement between the shaft portion 376 of the distal end 372 of the alignment pin 370 and the guide recess 360.

The alignment pin 370 can be dimensioned for a press fit within the blind hole 329 and extends along an axis that is substantially perpendicular to the top surface 322. The alignment pin 370 comprises a shaft portion 376 having a proximal end 374 and the distal end 372. In one embodiment, the distal end 372 can have a tapered portion 377. The shaft portion 376 can be of substantially uniform cross-section along its length and extend into the blind hole 329 such that the proximal end 374 butts against the terminus of the blind hole 329. The tapered portion 377 can be configured akin to the tapered portion 357 of alignment pin 350.

Referring to FIG. 8, the alignment pins 370 can include a metal core 378 and a polymer sleeve or coating 379 on the guide surface in an embodiment of the invention. In other embodiments, alignment pins 370 can be manufactured entirely from low particulate generating material such as stainless steel or TORLON.

Figure 9:
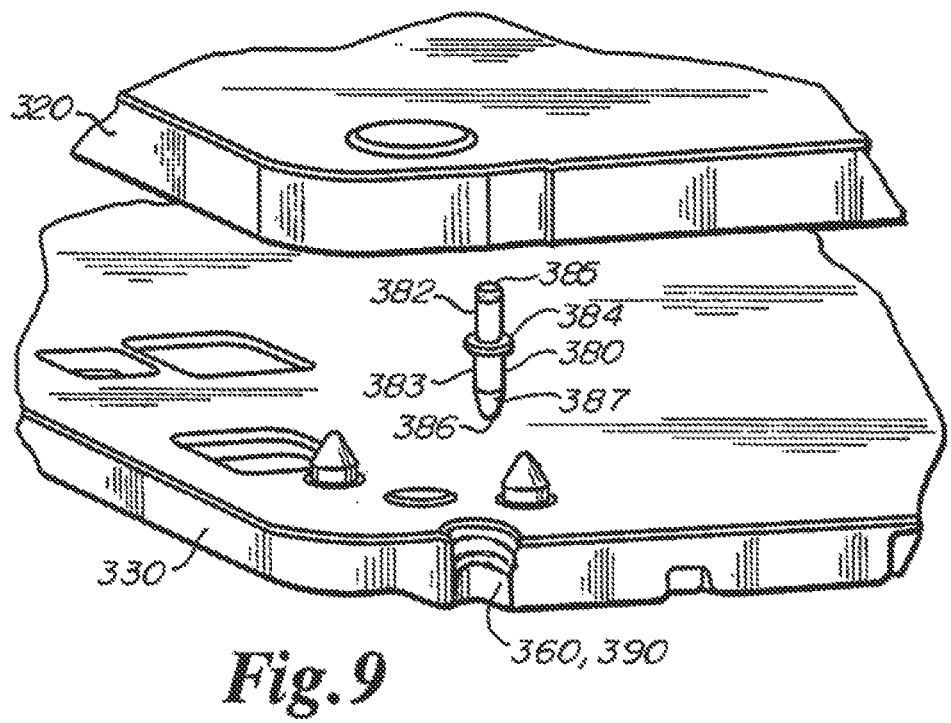
FIG. 9 is a partial perspective, exploded view of an inner pod according to an embodiment of the invention where a blind hole receives a alignment pin.
Figure 9A:
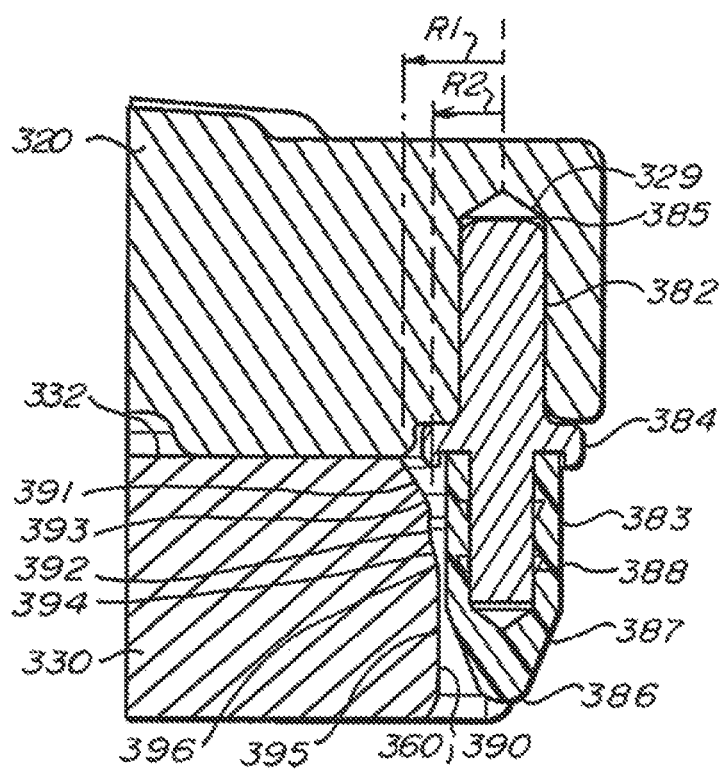
FIG. 9A is a partial sectional view of the alignment pin of FIG. 9 in assembly in an embodiment of the invention.

Referring to FIGS. 9 and 9A, a reticle pod 378 including an alignment pin 380 is depicted in an embodiment of the invention. The alignment pin 380 is dimensioned for a press fit within the blind hole 329 in the cover 320 and extends along an axis that is substantially perpendicular to the top surface 322. The alignment pin 380 comprises an upper shaft portion 382 and a lower shaft portion 383. In one embodiment, the lower shaft portion 383 can be dimensioned to accommodate the polymer sleeve 379 that covers the shaft portion 383. The lower shaft portion 383 can include barbs 388 that help secure the polymer sleeve 379 to the lower shaft portion 383. A stop ridge 384 can be provided circumferentially around the shaft between the upper shaft portion 382 and the lower shaft portion 383. The alignment pin 380 has a proximal end 385 on the upper shaft portion 382 and a distal end 386 on the lower shaft portion 383. In one embodiment, the distal end 386 can include a tapered portion 387, akin to the tapered portion 357 of alignment pin 350. In one embodiment, the upper shaft portion 382 is characterized by a substantially uniform cross-section along its length and extends into the blind hole 329.

The alignment pins 380 can comprise a metal core and a polymer coating or sleeve on the lower shaft portion 383 that conforms to the profile of the metal core. In other embodiments, alignment pins 380 can be manufactured entirely from low particulate generating material such as stainless steel or TORLON.

Functionally, the stop ridge 384 provides registration at the mouth of the blind hole 329 during assembly, so that the distance that the lower shaft portion 383 extends below the cover 320 is predetermined to within a small tolerance. The stop ridge 384 also shields the proximal end of the polymer sleeve 379 from being torn away due to incidental contact, and can also serve as a crimping structure that helps secure the polymer sleeve 379 in the radial direction.

In some embodiments, the guide recess 360 includes a contoured wall 390. In the depicted embodiment, the contoured wall defines a first tapered portion 391 immediately adjacent the top surface 332 of the base 330, with a first right-cylindrical portion 392 immediately adjacent the first tapered portion 391. The first tapered portion 391 defines a first radius R1 on the top surface 332 of the base 330 that is greater than a second radius R2 of the first right-cylindrical portion 392. A first ridge 393 is defined at the confluence of the first tapered portion 391 and the first right-cylindrical portion 392. The first ridge 393 can be radiused, as depicted.

In one embodiment (as depicted), the contoured wall 390 also includes a second tapered portion 394 immediately distal to the first right-cylindrical portion 392, followed by a second right-cylindrical portion 395 immediately distal thereto. A second ridge 396 is defined at the confluence of the second tapered portion 394 and the second right-cylindrical portion 395. The second ridge 396 can be radiused, as depicted.

In operation, the ridge(s) 393, 396 effectively provides a protrusion that protrudes outward and upward, so that the tapered portion 387 of the alignment pin 280 makes point or line contact with the ridge(s) 393, 396. The point or line contact reduces the effective areas that are in contact when the cover 320 is moved axially onto the base 330, thereby reducing the potential for particle generation.

Figure 10:
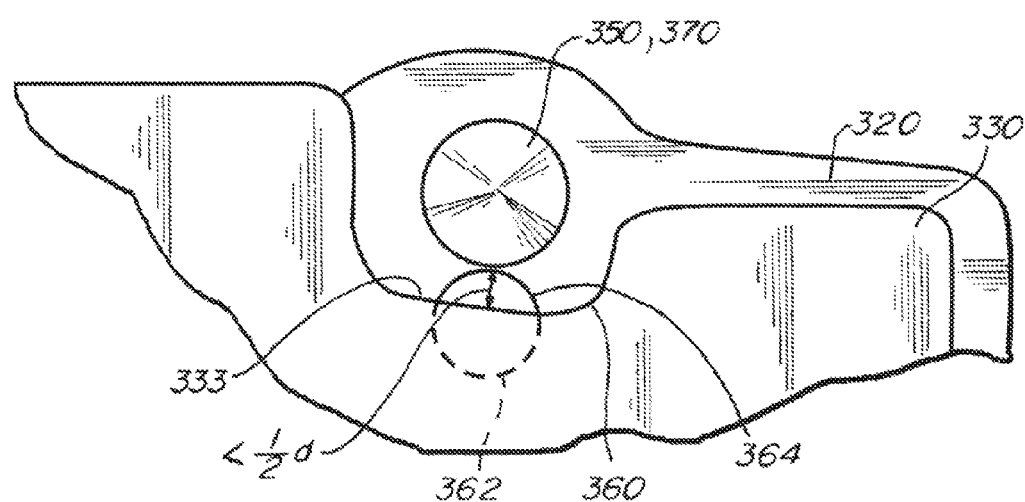
FIG. 10 is a portion of the bottom view of an assembled inner pod where the guide recess includes a concavity housing a ball according to an embodiment of the invention.
Figure 10A:
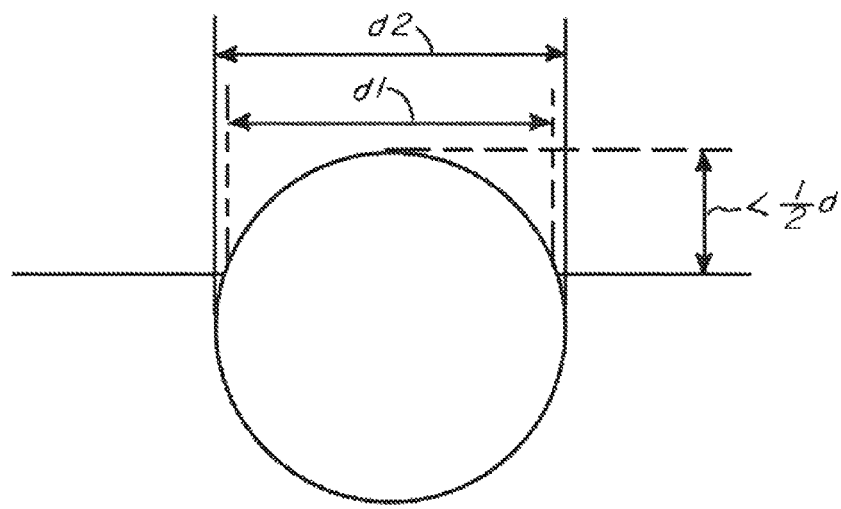
FIG. 10A is an enlarged detail view of a portion of FIG. 10.

Referring to FIGS. 10 and 10A, the base 330 can be provided with a recess that includes a ball 364 in an embodiment of the invention. The ball 364 is press fit into the concavity 362 so that a portion of the ball 364 extends beyond the concavity 362. In one embodiment, the diameter d1 at the portion of the concavity that is adjacent the lateral surface 333 is slightly less than the diameter d2 of the concavity just internal to the concavity. The guide recess 360 with ball 364 is positioned on the base 330 such that when the cover 320 is in engagement with the base 330, the distal end 352 or 372 of the alignment pin 350 or 370 is located at a location within the guide recess 360, resulting in a close mating engagement between the distal end 352 or 372 of the alignment pin 350 or 370 and the ball 364. In one embodiment, the ball 364 is made from a polymer material.

Functionally, the ball 364 defines a projection that provides essentially a point contact between the outer radial surface of the alignment pin 350 or 370 and the spherical surface of the ball 364 during guidance of the alignment pin 350, 370. The contact surface area, and attendant potential for particle generation, is thereby reduced.

The depictions and descriptions herein portray the various alignment pins 350, 370, 380 as being attached to the cover 320 and the guide recess 360 as being formed in the base 330. It is understood that the positions of these aspects can be reversed—i.e., the pins being attached to the base 330 and the guide recess being formed in the cover 320.

Also, the depictions and descriptions herein portray the guide recess 360 as defining a concavity formed on the edge 331. It is understood that the guide recess can also define a hole or aperture (not depicted) that passes through the thickness of the base 330 or cover 320.

References to relative terms such as upper and lower, front and back, left and right, top and bottom, horizontal, or the like, are intended for convenience of description and are not contemplated to limit the invention, or its components, to any one positional or special orientation. All dimensions depicted in the figures can vary with a potential design and the intended use of a specific embodiment of this invention without departing from the scope thereof.

Each of the additional figures and methods disclosed herein can be used separately, or in conjunction with other features and methods, to provide improved containers and methods for making and using the same. Therefore, combinations of features and methods disclosed herein may not be necessary to practice the invention in its broadest sense and are instead disclosed merely to particularly describe representative and preferred embodiments of the instant invention.

Various modifications to the embodiments of the inventions may be apparent to one of skill in the art upon reading this disclosure. For example, persons of ordinary skill in the relevant art will recognize that the various features described for the different embodiments of the inventions can be suitably combined, un-combined, and re-combined with other features, alone, or in different combinations, within the spirit of the invention. Likewise, the various features described above should all be regarded as example embodiments, rather than limitations to the scope or spirit of the inventions. Therefore, the above is not contemplated to limit the scope of the inventions.

Persons of ordinary skill in the relevant arts will recognize that the inventions may comprise fewer features than illustrated in any individual embodiment described above. The embodiments described herein are not meant to be an exhaustive presentation of the ways in which the various features of the inventions may be combined. Accordingly, the embodiments are not mutually exclusive combinations of features; rather, the inventions may comprise a combination of different individual features selected from different individual embodiments, as understood by persons of ordinary skill in the art.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the embodiments of the inventions, it is expressly intended that the provisions of Section 112, sixth paragraph of 35 U.S.C. are not to be invoked unless the specific terms "means for" or "step for" are recited in a claim.

What is claimed is:

1. A reticle carrier for containment of a reticle, comprising:
    an outer pod assembly including an upper portion and a lower portion that cooperate to define an enclosure; and
    an inner pod assembly for storage of a reticle therein, said inner pod assembly being adapted for containment within said enclosure of said outer pod assembly, said inner pod assembly including:
    a cover and a base concentric about a central axis, said central axis defining an axial direction, and
    an alignment system including structure defining a hole provided in one of said cover and said base, a guide recess formed proximate an edge of the other of said cover and said base, and an alignment pin disposed in said hole;
    wherein said alignment pin is disposed in said guide recess when said cover and base are engaged, said guide recess being adapted to guide said alignment pin when said cover is moved in said axial direction toward said base for alignment of said cover with said base.

2. The reticle carrier of claim 1, wherein said hole is a through hole.

3. The reticle carrier of claim 2, wherein said alignment pin includes a head that is positioned above said through hole.

4. The reticle carrier of claim 1, wherein said hole is a blind hole.

5. The reticle carrier of claim 4, further comprising structure defining a vent in fluid communication with said blind hole.

6. The reticle carrier of claim 1, wherein a projection extends radially inward from said guide recess for contact with said alignment pin when said cover is moved axially with respect to said base.

7. The reticle carrier of claim 6, further comprising:
    a concavity provided in said guide recess; and
    a ball disposed in said concavity to provide said projection.

8. The reticle carrier of claim 1, wherein said guide recess includes a contoured wall, said contoured wall including a ridge that provides line or point contact with said alignment pin during movement of said pin in said axial direction.

9. The reticle carrier of claim 8, wherein said contoured wall comprises:
    a tapered portion immediately adjacent an interior-facing surface of the other of said cover and said base, said tapered portion defining a first radius on said interior-facing surface of the other of said cover and said base; and
    a right-cylindrical portion immediately adjacent said tapered portion, said right-cylindrical portion defining a second radius that is less than said first radius,
    wherein a confluence of said tapered portion and said right cylindrical portion define a ridge on said contoured wall.

10. The reticle carrier of claim 1, wherein each of said base and said cover are metallic.

11. The reticle carrier of claim 1, wherein said base is a unitary structure formed from a single block of material.

12. The reticle carrier of claim 11, wherein said material is metallic.

13. The reticle carrier of claim 1, wherein said alignment pin comprises a metal core having an upper shaft portion and a lower shaft portion, and a polymer sleeve or coating that covers at least said lower shaft portion.

14. The reticle carrier of claim 13, wherein said polymer sleeve or coating comprises a polyamide-imide material.

15. The reticle carrier of claim 13, wherein said lower shaft portion includes barbs that protrude radially outward therefrom for securing polymer sleeve or coating to said lower shaft portion.

16. The reticle carrier of claim 1, wherein said alignment pin includes a stop ridge.

17. The reticle carrier of claim 1, wherein said guide recess is a concavity formed on said edge.

18. A reticle carrier for containment of a reticle, comprising:
    a pod assembly for storage of a reticle therein, said pod assembly including:
    a metallic cover and a metallic base concentric about a central axis, said central axis defining an axial direction, the metallic cover and metallic base having a metal to metal flat planar cooperating sealing surfaces, and
    an alignment system including structure defining a hole provided in one of said cover and said base, pin receiving structure formed proximate an edge of the other of said cover and said base, and an alignment pin disposed in said hole;

wherein said alignment pin is disposed in said pin receiving structure when said cover and base are engaged, said pin receiving structure being adapted to guide said alignment pin when said cover is moved in said axial direction toward said base for alignment of said cover with said base.

\* \* \* \* \*